(12) United States Patent
Lee et al.

(10) Patent No.: US 8,310,312 B2
(45) Date of Patent: Nov. 13, 2012

(54) AMPLIFIERS WITH IMPROVED LINEARITY AND NOISE PERFORMANCE

(75) Inventors: Hanil Lee, San Diego, CA (US); Li-Chung Chang, Irvine, CA (US)

(73) Assignee: QUALCOMM, Incorporated, San Diego, CA (US)

( * ) Notice: Subject to any disclaimer, the term of this patent is extended or adjusted under 35 U.S.C. 154(b) by 7 days.

(21) Appl. No.: 12/539,507

(22) Filed: Aug. 11, 2009

(65) Prior Publication Data

US 2011/0037518 A1   Feb. 17, 2011

(51) Int. Cl.
*H03F 3/68* (2006.01)
(52) U.S. Cl. .......................................... 330/295
(58) Field of Classification Search ................. 330/283, 330/295.311
See application file for complete search history.

(56) References Cited

U.S. PATENT DOCUMENTS

| | | | | |
|---|---|---|---|---|
| 6,600,377 | B2 * | 7/2003 | Sasaki | 330/311 |
| 6,987,422 | B2 * | 1/2006 | Vice | 330/285 |
| 7,019,593 | B2 * | 3/2006 | Krishnasamy Maniam et al. | 330/302 |
| 7,098,737 | B2 * | 8/2006 | Fujimoto et al. | 330/283 |
| 7,205,846 | B1 * | 4/2007 | Ding et al. | 330/311 |
| 7,319,364 | B2 * | 1/2008 | Kim et al. | 330/295 |
| 7,696,828 | B2 | 4/2010 | Chang | |
| 2006/0164171 | A1 | 7/2006 | Wu | |
| 2007/0096827 | A1 * | 5/2007 | Nguyen | 330/295 |

FOREIGN PATENT DOCUMENTS

| | | |
|---|---|---|
| DE | 10344878 | 4/2005 |
| WO | WO0141302 | 6/2001 |
| WO | WO2009088813 | 7/2009 |

OTHER PUBLICATIONS

Aparin, V.; Larson, L.E.; "Modified derivative superposition method for linearizing FET low-noise amplifiers", Microwave Theory and Techniques, IEEE Transactions on, vol. 53, Issue 2, Feb. 2005 pp. 571-581.

Che-Sheng Chen et al: "A 2.5GHz 90nm CMOS Triple Gain Mode LNA for WiMAX Applications" Signals, Systems and Electronics, 2007. ISSSE 07. International Symposium on, IEEE, PI, Jul. 1, 2007, pp. 367-369, XP031129290 ISBN: 978-1-4244-1448-2 p. 367, left-hand column, line 15—p. 368, right-hand column, line 11; figures 2-4.

International Search Report and Written Opinion—PCT/US2010/045223, International Search Authority—European Patent Office—Dec. 16, 2010.

* cited by examiner

*Primary Examiner* — Robert Pascal
*Assistant Examiner* — Khiem Nguyen
(74) *Attorney, Agent, or Firm* — Ramin Mobarhan

(57) ABSTRACT

Amplifiers with improved linearity and noise performance are described. In an exemplary design, an apparatus includes first through sixth transistors. The first transistor receives an input signal and provides an amplified signal. The second transistor receives the amplified signal and provides signal drive for an output signal. The third transistor receives the input signal and provides an intermediate signal. The fourth transistor provides bias for the third transistor in a high linearity mode. The fifth transistor receives the intermediate signal and provides signal drive for the output signal in a low linearity mode. The third and fourth transistors form a deboost path that is enabled in the high linearity mode to improve linearity. The third and fifth transistors form a cascode path that is enabled in the low linearity mode to improve gain and noise performance. The sixth transistor generates distortion component used to cancel distortion component from the first transistor.

25 Claims, 8 Drawing Sheets

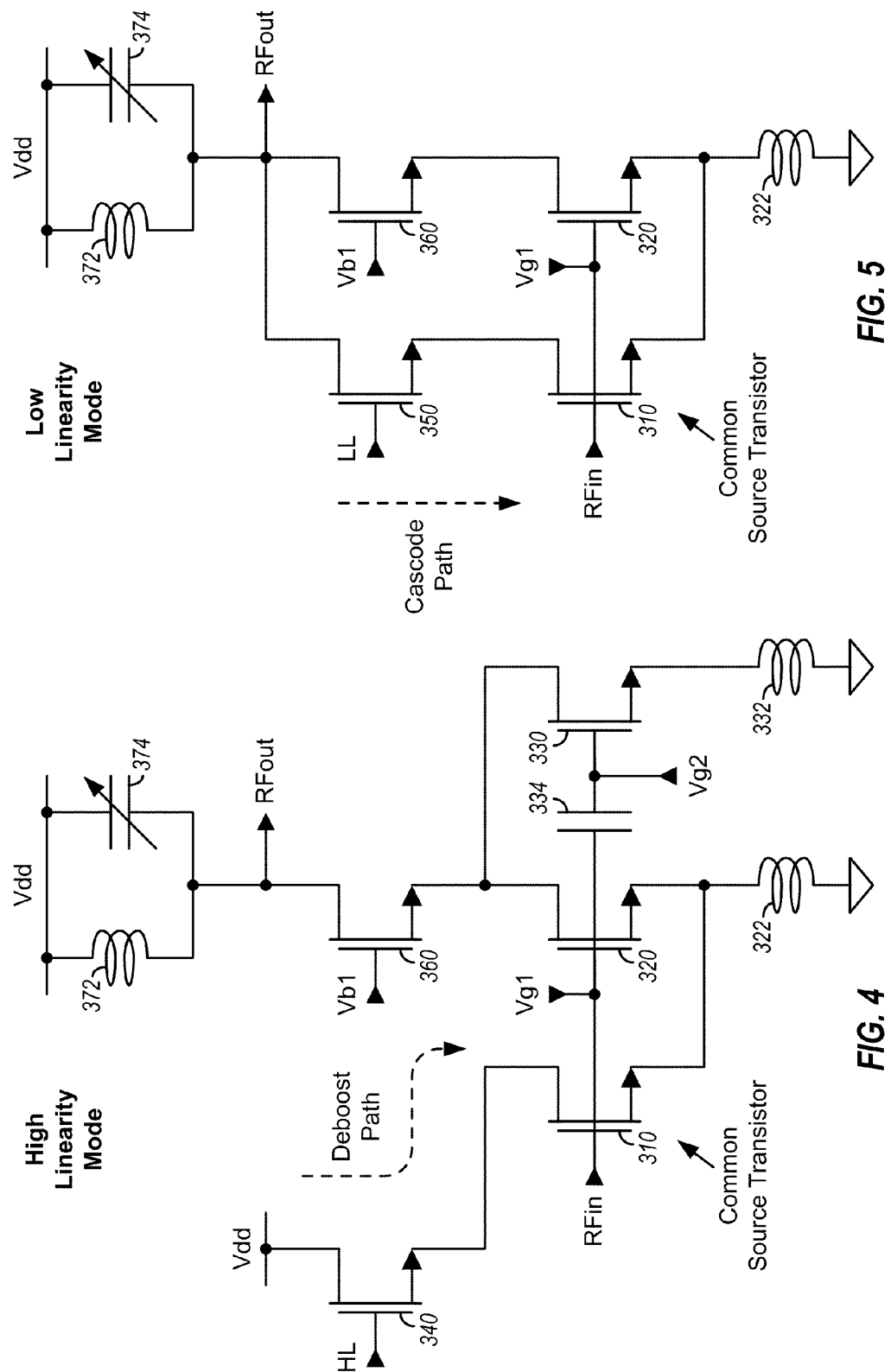

AMPLIFIERS WITH IMPROVED LINEARITY AND NOISE PERFORMANCE

BACKGROUND

I. Field

The present disclosure relates generally to electronics, and more specifically to amplifiers.

II. Background

Amplifiers are commonly used in various electronics devices to provide signal amplification. Different types of amplifiers are available for different uses. For example, a wireless communication device such as a cellular phone may include a transmitter and a receiver for bi-directional communication. The receiver may utilize a low noise amplifier (LNA), the transmitter may utilize a power amplifier (PA), and the receiver and transmitter may utilize variable gain amplifiers (VGAs).

An LNA is commonly used in a receiver to amplify a low-amplitude signal received via a communication channel. The LNA is often the first active circuit encountered by the received signal and hence has a large impact on the performance of the receiver in several key areas. First, the LNA has a large influence on the overall noise figure of the receiver since the noise of the LNA is injected directly into the received signal and the noise of subsequent circuits is effectively reduced by the gain of the LNA. Second, the linearity of the LNA has a large influence on both the design of subsequent circuits in the receiver and the receiver performance. The LNA input signal typically includes various undesired signal components that may come from external interfering sources and leakage from a co-located transmitter. Nonlinearity of the LNA causes the undesired signal components to mix and generate cross modulation distortion components that may fall within the desired signal bandwidth. The amplitude of the distortion components is determined by the amount of nonlinearity of the LNA. Distortion components that fall within the desired signal bandwidth act as noise that may degrade the signal-to-noise ratio (SNR) of the desired signal, which may in turn degrade performance. Therefore, an LNA having good linearity and low noise figure may be highly desirable.

BRIEF DESCRIPTION OF THE DRAWINGS

FIG. 4 shows operation of the amplifier in a high linearity mode.

FIG. 5 shows operation of the amplifier in a low linearity mode.

DETAILED DESCRIPTION

The word "exemplary" is used herein to mean "serving as an example, instance, or illustration." Any design described herein as "exemplary" is not necessarily to be construed as preferred or advantageous over other designs.

Amplifiers with improved linearity and noise performance are described herein. These amplifiers may be used for various electronics devices such as wireless and wireline communication devices, cellular phones, personal digital assistants (PDAs), handheld devices, wireless modems, laptop computers, cordless phones, Bluetooth devices, broadcast receivers, etc. These amplifiers may also be used for various applications such as communication, networking, computing, consumer electronics, etc. For example, the amplifiers may be used in wireless communication systems such as Code Division Multiple Access (CDMA) systems, Time Division Multiple Access (TDMA) systems, Frequency Division Multiple Access (FDMA) systems, Orthogonal FDMA (OFDMA) systems, Single-Carrier FDMA (SC-FDMA) systems, wireless local area network (WLAN) systems, etc. The amplifiers may also be used for various radio technologies such as Global System for Mobile Communications (GSM) used in TDMA systems, CDMA 1X and Wideband CDMA (WCDMA) used in CDMA systems, Long Term Evolution (LTE) and LTE-Advanced (LTE-A) used in OFDMA and SC-FDMA systems, Global Positioning System (GPS), etc. For clarity, the use of the amplifiers in a wireless communication device is described below.

Figure 1:
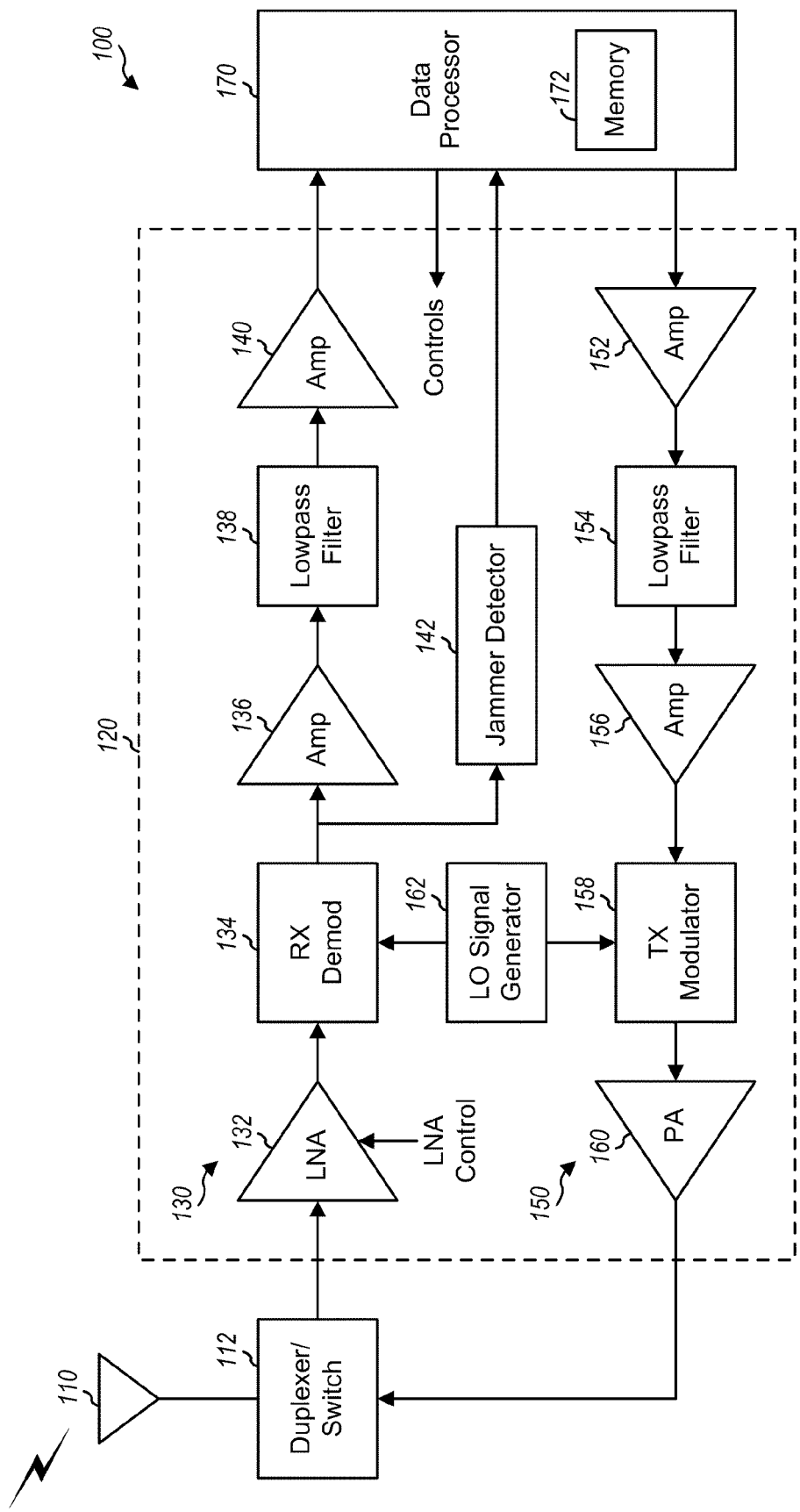
FIG. 1 shows a block diagram of a wireless communication device.

FIG. 1 shows a block diagram of an exemplary design of a wireless communication device 100, which may be a cellular phone or some other device. In the exemplary design shown in FIG. 1, wireless device 100 includes a transceiver 120 having a receiver 130 and a transmitter 150 that support bi-directional communication. In general, wireless device 100 may include any number of receivers and any number of transmitters for any number of communication systems and any number of frequency bands.

In the receive path, an antenna 110 receives signals transmitted by base stations and other transmitter stations and provides a received RF signal, which is routed through a duplexer/switch 112 and provided to receiver 130. Within receiver 130, the received RF signal is amplified by an LNA 132 and demodulated by a receive demodulator (RX Demod) 134 to obtain a downconverted signal. The downconverted signal is amplified by an amplifier (Amp) 136, filtered by a lowpass filter 138, and further amplified by an amplifier 140 to obtain an input baseband signal, which is provided to a data processor 170

In the transmit path, data processor 170 processes data to be transmitted and provides an output baseband signal to transmitter 150. Within transmitter 150, the output baseband signal is amplified by an amplifier 152, filtered by a lowpass filter 154, amplified by an amplifier 156, and modulated by a transmit (TX) modulator 158 to obtain a modulated signal. A power amplifier (PA) 160 amplifies the modulated signal to obtain a desired output power level and provides a transmit RF signal. The transmit RF signal is routed through duplexer/switch 112 and transmitted via antenna 110. A local oscillator (LO) signal generator 162 generates downconversion LO signals for demodulator 134 and upconversion LO signals for modulator 158.

A jammer detector 142 detects for jammers in the received RF signal based on the downconverted signal from demodulator 134 (or some other signal in the receive path) and provides a jammer indicator. A jammer is an undesired signal that may be much larger in amplitude than a desired signal and may be located close in frequency to the desired signal. Jammer detector 142 may detect for close-in jammers and farther-out jammers, e.g., using filters with different bandwidths. Jammer detection may also be performed based on digital samples obtained by digitizing the input baseband signal from amplifier 140. The operation of LNA 132 and/or other amplifiers may be controlled based on detected jammers. For example, an LNA control may be generated based on detected jammers and used to control the operation of LNA 132.

FIG. 1 shows an exemplary design of transceiver 120. In general, the conditioning of the signals in receiver 130 and transmitter 150 may be performed by one or more stages of amplifier, filter, upconverter, downconverter, etc. The circuit blocks may be arranged differently from the configuration shown in FIG. 1. Furthermore, other circuit blocks not shown in FIG. 1 may also be used to condition the signals in the transmitter and receiver. Some circuit blocks in FIG. 1 may also be omitted. All or a portion of transceiver 120 may be implemented on an analog integrated circuit (IC), an RF IC (RFIC), a mixed-signal IC, etc.

Data processor 170 may perform various functions for wireless device 100, e.g., processing for transmitted and received data. Data processor 170 may also generate controls (e.g., LNA control) for various circuit blocks in transceiver 120. A memory 172 may store program codes and data for data processor 170. Data processor 170 and memory 172 may be implemented on one or more application specific integrated circuits (ASICs) and other ICs.

Figure 2A:
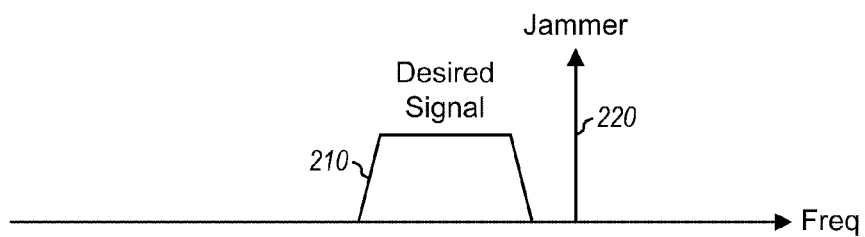
FIG. 2A shows a received radio frequency (RF) signal from an antenna.

FIG. 2A shows the received RF signal from antenna 110. The received RF signal may include a desired signal 210 and a jammer 220. Jammer 220 is an undesired signal and may correspond to, for example, a signal transmitted by a nearby base station in an Advanced Mobile Phone System (AMPS) system.

Figure 2B:
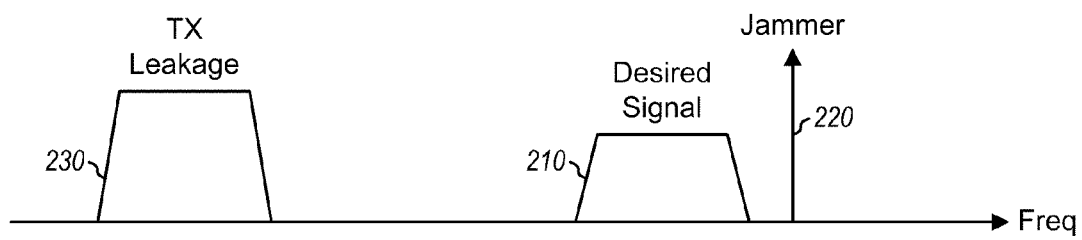
FIG. 2B shows an input RF signal at the input of an LNA.

FIG. 2B shows the input RF signal at the input of LNA 132. The input RF signal may include desired signal 210 and jammer 220 in the received RF signal as well as a TX leakage signal 230 from the transmit path. The TX leakage signal may be large relative to the desired signal, especially if wireless device 100 is far from a serving base station and needs to transmit at a high power level in order to reach the serving base station.

Figure 2C:
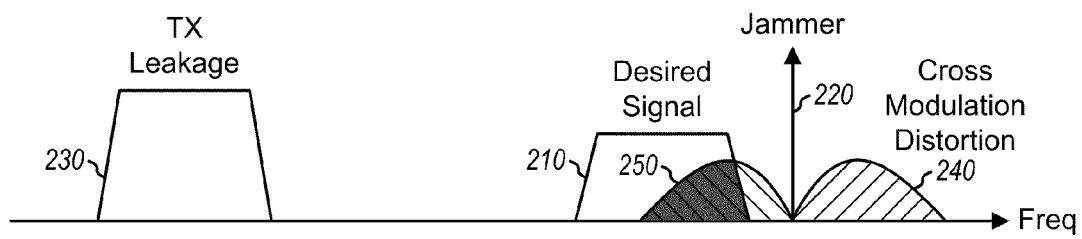
FIG. 2C shows an output RF signal at the output of the LNA.

FIG. 2C shows the output RF signal at the output of LNA 132. Nonlinearity of LNA 132 may cause TX leakage signal 230 to interact with narrowband jammer 220 and generate cross modulation distortion components 240 around the jammer. A portion 250 of the cross modulation distortion, which is shown with shading, may fall within the desired signal band. Portion 250 would act as additional noise that may degrade the performance of the receiver. This noise may also degrade receiver sensitivity so that the smallest desired signal that can be reliably detected by the receiver needs to have a larger amplitude.

In an aspect, an amplifier capable of achieving high linearity and low noise figure may be used for LNA 132. The amplifier may support multiple operating modes, which may include a high linearity mode, a low linearity mode, and possibly other modes. The high linearity mode may be used to obtain high linearity for the amplifier and may be selected when strong jammers are detected. The low linearity mode may be used to obtain low noise figure (i.e., improved noise performance) for the amplifier and may be selected when strong jammers are not detected.

Figure 3:
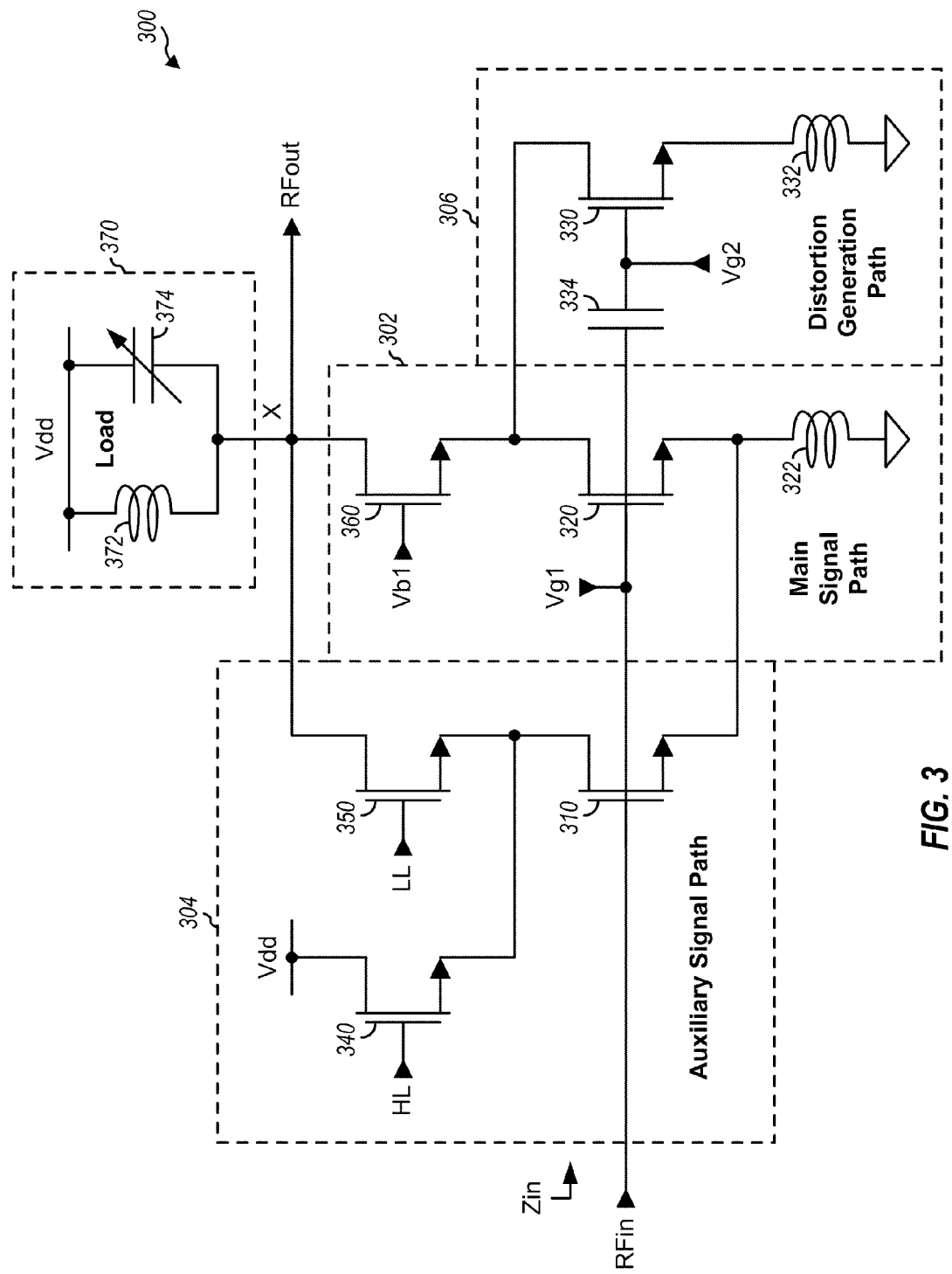
FIG. 3 shows an amplifier with improved linearity and noise performance.

FIG. 3 shows a schematic diagram of an exemplary design of an amplifier 300, which is capable of achieving high linearity and low noise figure. Amplifier 300 may be used for LNA 132 in FIG. 1 and possibly other amplifiers in receiver 130 and transmitter 150. In the exemplary design shown in FIG. 3, amplifier 300 includes a main signal path 302, an auxiliary signal path 304, and a distortion generation path 306. Main signal path 302 includes N-channel metal oxide semiconductor (NMOS) transistors 320 and 360 that provide signal amplification for an input RF signal (RFin) and provide signal drive for an output RF signal (RFout). Auxiliary signal path 304 includes NMOS transistors 310, 340 and 350 that may be operated to improve the linearity or noise figure of amplifier 300. Distortion generation path 306 includes an NMOS transistor 330 that generates distortion components used to cancel distortion components from main signal path 302 and hence improve the linearity of amplifier 300.

NMOS transistors 310 and 320 are coupled in parallel and have their gates coupled together and their sources coupled together. The input RF signal is provided to the gates of NMOS transistors 310 and 320. An inductor 322 is coupled between the sources of NMOS transistors 310 and 320 and circuit ground and provides source degeneration for these NMOS transistors. NMOS transistor 330 has its gate coupled to one end of a capacitor 334, its drain coupled to the drain of NMOS transistor 320, and its source coupled to one end of an inductor 332. Capacitor 334 provides AC coupling and has its other end receiving the input RF signal. Inductor 332 provides source degeneration for NMOS transistor 330 and has its other end coupled to circuit ground.

NMOS transistor 340 has its gate receiving a high linearity (HL) control signal, its source coupled to the drain of NMOS transistor 310, and its drain coupled to a power supply, Vdd. NMOS transistor 350 has its gate receiving a low linearity (LL) control signal, its source coupled to the drain of NMOS transistor 310, and its drain coupled to an output node X. NMOS transistor 360 has its gate receiving a Vb1 bias voltage, its source coupled to the drains of NMOS transistors 320 and 330, and its drain coupled to output node X.

A load 370 includes an inductor 372 and a variable capacitor 374 coupled in parallel and between the power supply and output node X. Inductor 372 and capacitor 374 form a resonator circuit having a resonant frequency that may be adjusted by varying the capacitance of capacitor 374. The resonant frequency may be set to a frequency channel or band of interest. Output node X provides the output RF signal.

NMOS transistors 320 and 360 form a first cascode pair used for signal amplification. NMOS transistor 320 provides signal amplification. NMOS transistor 360 provides load isolation for NMOS transistor 320 and also provides signal drive for the output RF signal. NMOS transistors 310 and 340 form a deboost path that may be enabled to improve the linearity of amplifier 300, as described below. NMOS transistors 310 and 350 form a second cascode pair that may be enabled to provide additional signal amplification and improve gain and noise performance. NMOS transistor 310 provides signal amplification. NMOS transistor 350 provides load isolation for NMOS transistor 310 and also provides signal drive for the output RF signal. NMOS transistor 330 generates cross modulation distortion components used for distortion cancellation based on a modified derivative superposition (MDS) method. NMOS transistor 330 may be enabled to improve the linearity of amplifier 300.

Inductor 322 provides source degeneration for NMOS transistors 310 and 320 and may further provide input impedance matching looking into the gates of NMOS transistors 310 and 320. Inductor 332 provides source degeneration for NMOS transistor 330 and is also used to generate the proper distortion components for distortion cancellation.

FIG. 3 shows an exemplary design of amplifier 300 capable of achieving high linearity and low noise figure. Amplifier 300 may also be implemented in other manners. For example, the source of NMOS transistor 330 may be coupled to a center tap of inductor 322 instead of separate inductor 332. The drain of NMOS transistor 330 may be coupled to a cascode NMOS transistor, which may be coupled to output node X, e.g., similar to NMOS transistor 350 or 360. The gate of NMOS transistor 330 may be coupled to the drain (instead of the gate) of NMOS transistor 320 via AC coupling capacitor 334. Load 370 may be replaced with a transformer having a primary coil and a secondary coil. The primary coil may be coupled between the Vdd power supply and output node X, and the secondary coil may be coupled to a subsequent circuit, e.g., downconverter 134 in FIG. 1. Load 370 may also be replaced with an active load, which may be implemented with P-channel metal oxide semiconductor (PMOS) transistors or some other type of transistors.

In an exemplary design, amplifier 300 may operate in a high linearity mode or a low linearity mode. The high linearity mode may be used to obtain high linearity for amplifier 300 and may be selected when greater linearity is desired to reduce cross modulation distortion. The low linearity mode may be used to obtain lower noise figure for amplifier 300 and may be selected when high linearity is not required and better noise performance is desired. In an exemplary design, the high or low linearity mode may be selected based on jammer level. The high linearity mode may be selected if the jammer level exceeds a TH1 threshold, and the low linearity mode may be selected if the jammer level falls below a TH2 threshold. TH1 may be higher than TH2 to provide hysteresis and avoid continually toggling between the high and low linearity modes when the jammer level fluctuates near the TH1 or TH2 threshold. The high or low linearity mode may also be selected based on other factors.

In general, any number of operating modes may be supported by amplifier 300. Each operating mode may be associated with certain transistors within amplifier 300 being enabled to provide the desired performance (e.g., higher linearity or lower noise figure) for that operating mode. Different operating modes may also be associated with different amounts of bias current for the transistors within amplifier 300. For example, more bias current may be used for operating modes requiring higher linearity. The different operating modes for amplifier 300 may be selected based on jammer level and/or other factors. For clarity, much of the description below assumes two operating modes, the high and low linearity modes, for amplifier 300.

FIG. 4 shows operation of amplifier 300 in the high linearity mode. In this exemplary design of the high linearity mode, NMOS transistors 310 and 340 in the deboost path are enabled by a high voltage on the HL control signal. NMOS transistors 320 and 360 in the main signal path are enabled by the Vg1 and Vb1 bias voltages, respectively. NMOS transistor 330 in the distortion generation path is enabled by a Vg2 bias voltage. NMOS transistor 350 (not shown in FIG. 4) is disabled by a low voltage on the LL control signal.

NMOS transistor 320 provides signal amplification for the input RF signal and has nonlinearity. NMOS transistors 310 and 340 in the deboost path improve the linearity of NMOS transistor 320. When the deboost path is enabled as shown in FIG. 4, NMOS transistor 310 provides a source current of $i_{s1}$, which is summed with a source current of $i_{s2}$ from NMOS transistor 320. The summed current of $i_{s1}+i_{s2}$ is passed through inductor 322. The source current of NMOS transistor 310 thus increases the current through inductor 322, which increases the effective inductance of inductor 322. The higher inductance results in more source degeneration for NMOS transistor 320, which improves the linearity of NMOS transistor 320. The gain of NMOS transistor 320 may be minimally impacted by NMOS transistor 310 being turned on. There may thus be negligible gain loss in the main signal path due to the deboost path being enabled.

NMOS transistor 330 generates third-order distortion component used to cancel third-order distortion component from NMOS transistor 320 and hence improve linearity. NMOS transistor 320 has a small-signal transconductance of $g_1$, which is determined by various factors such as the size (e.g., length and width) of NMOS transistor 320, the bias current for NMOS transistor 320, the gate-to-source voltage $v_{gs}$ of NMOS transistor 320, etc. NMOS transistor 360 has a small-signal transconductance of $g_1/\alpha$, where $\alpha$ is the ratio of the transconductance of NMOS transistor 320 to the transconductance of NMOS transistor 360. The factor $\alpha$ is typically determined by the ratio of the width of NMOS transistor 320 to the width of NMOS transistor 360. NMOS transistor 330 has a small-signal transconductance of $g_1/\beta$, where $\beta$ is the ratio of the transconductance of NMOS transistor 320 to the transconductance of NMOS transistor 330. The factor $\beta$ is typically determined by the ratio of the width of NMOS transistor 320 to the width of NMOS transistor 330. The factors $\alpha$ and $\beta$ may be selected as described below.

Linearization of amplifier 300 using the MDS method may be achieved at low frequency as follows. At low frequency, inductor 322 is effectively shorted and does not come into play, and the $v_{gs}$ voltage of NMOS transistor 320 is equal to the input RF signal voltage. The drain current $i_d$ of NMOS transistor 320 may be represented by a power series as follows:

$$i_d(v_{gs}) = g_1 \cdot v_{gs} + g_2 \cdot v_{gs}^2 + g_3 \cdot v_{gs}^3 +$$ Eq (1)

where $g_2$ is a coefficient that defines the strength of second-order nonlinearity, $g_3$ is a coefficient that defines the strength of third-order nonlinearity, and $i_d(v_{gs})$ is the drain current of NMOS transistor 320 as a function of $v_{gs}$.

For simplicity, nonlinearities higher than third order are ignored in equation (1). Coefficients $g_1$, $g_2$ and $g_3$ are determined by the device size and the bias current for NMOS transistor 320. The Vg1 bias voltage may be set to obtain a desired bias current for NMOS transistor 320. Coefficient $g_3$ controls the third-order intermodulation distortion (IMD3) at low signal level and hence determines the third-order input intercept point (IIP3), which is a metric commonly used to specify the linearity of an amplifier.

Similarly, the drain current of NMOS transistor 330 is a function of the input RF signal voltage and may be represented by the power series shown in equation (1). For the MDS method, a positive $g_3$ coefficient with a particular $g_3$ curvature for NMOS transistor 320 may be canceled with a negative $g_3$ coefficient with a mirrored $g_3$ curvature for NMOS transistor 330. The Vg2 bias voltage for NMOS transistor 330 may be set to obtain the desired $g_3$ coefficient and curvature for NMOS transistor 330. Inductor 332 allows for adjustment of the magnitude and phase of the third-order distortion component from NMOS transistor 330 to match the magnitude and phase of the third-order distortion component from NMOS transistor 320.

At high frequency, the drain current of NMOS transistor 320 may be represented by a Volterra series, which is often used for nonlinear analysis. The Volterra series includes a Volterra kernel for each order of nonlinearity. The third-order Volterra kernel determines third-order nonlinearity at high frequency, which is of interest. The Volterra series may be evaluated to determine distortion components of interest, which are those that affect IIP3. NMOS transistor 330 may be used to generate distortion components used to cancel distortion components generated by third-order nonlinearity of NMOS transistor 320.

FIG. 5 shows operation of amplifier 300 in the low linearity mode. In this exemplary design of the low linearity mode, NMOS transistors 310 and 350 in the cascode path are enabled by a high voltage on the LL control signal. NMOS transistors 320 and 360 in the main signal path are enabled by the Vg1 and Vb1 bias voltages, respectively. NMOS transistor 340 (not shown in FIG. 5) is disabled by a low voltage on the HL control signal. NMOS transistor 330 (also not shown in FIG. 5) is disabled by a low Vg2 bias voltage. NMOS transistor 330 is not needed in the low linearity mode and may degrade noise figure if enabled. Turning off NMOS transistor 330 in the low linearity mode may improve the noise figure of amplifier 300 in this mode.

NMOS transistor 320 provides signal amplification for the input RF signal and is buffered by NMOS transistor 360. NMOS transistor 310 provides additional signal amplification for the input RF signal and is buffered by NMOS transistor 350. NMOS transistors 310 and 350 and NMOS transistors 320 and 360 form two signal paths or branches that are coupled in parallel. NMOS transistors 310 and 350 increase the signal gain and improve the noise performance of amplifier 300 in the low linearity mode.

As shown in FIGS. 4 and 5, NMOS transistor 310 is a common source (CS) transistor that is shared by both the high and low linearity modes. In the high linearity mode, NMOS transistor 350 is disabled, and NMOS transistors 310 and 340 form the deboost path that improves the linearity of amplifier 300. In the low linearity mode, NMOS transistor 340 is disabled, and NMOS transistors 310 and 350 form the cascode path that improves the gain and noise figure of amplifier 300. NMOS transistor 310 is thus enabled in both the high and low linearity modes but is used in different manners in the two modes.

Sharing NMOS transistor 310 for both the high and low linearity modes may provide various advantages. First, if NMOS transistor 350 is omitted (i.e., not included in amplifier 300), then NMOS transistor 310 would be turned off in the low linearity mode when NMOS transistor 340 is disabled. The turned off NMOS transistor 310 would then act as a parasitic capacitance that would degrade the noise figure of amplifier 300 in the low linearity mode. Higher power consumption may then be required to obtain a given noise figure. The parasitic capacitance and degradation in noise figure are avoided by reusing NMOS transistor 310 in the low linearity mode. Second, amplifier 300 has similar input impedance, Zin, in both the high and low linearity modes due to NMOS transistor 310 being enabled in both modes. The constant Zin may simplify input impedance matching for amplifier 300 in the high and low linearity modes.

Figure 6:
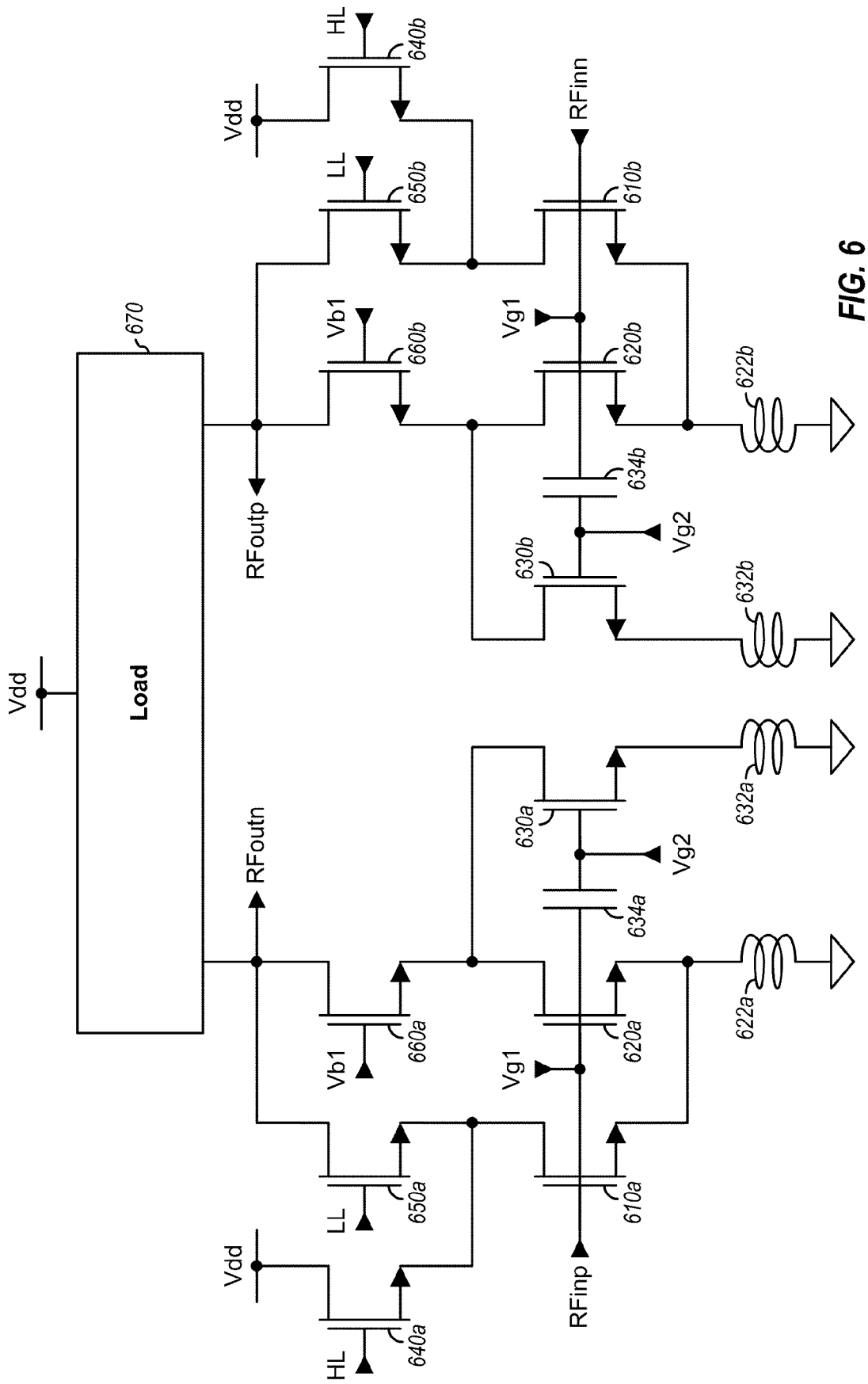
FIG. 6 shows a differential amplifier with improved linearity and noise performance.

FIG. 6 shows a schematic diagram of an exemplary design of a differential amplifier 600, which is capable of achieving high linearity and low noise figure. Amplifier 600 may also be used for LNA 132 in FIG. 1 and possibly other amplifiers in receiver 130 and transmitter 150. In the exemplary design shown in FIG. 6, amplifier 600 includes NMOS transistors 610a, 620a, 630a, 640a, 650a and 660a, inductors 622a and 632a, and a capacitor 634a, which are coupled in similar manner as NMOS transistors 310, 320, 330, 340, 350 and 360, inductors 322 and 332, and capacitor 334, respectively, in FIG. 3. Amplifier 600 further includes NMOS transistors 610b, 620b, 630b, 640b, 650b and 660b, inductors 622b and 632b, and a capacitor 634b, which are coupled in similar manner as NMOS transistors 610a, 620a, 630a, 640a, 650a and 660a, inductors 622a and 632a, and capacitor 634a, respectively. A non-inverting input RF signal (RFinp) is provided directly or indirectly to the gates of NMOS transistors 610a, 620a and 630a. An inverting input RF signal (RFinn) is provided directly or indirectly to the gates of NMOS transistors 610b, 620b and 630b. An inverting output RF signal (RFoutn) is provided by the drains of NMOS transistors 650a and 660a. A non-inverting output RF signal (RFoutp) is provided by the drains of NMOS transistors 650b and 660b. A load 670 is coupled to the drains of NMOS transistors 650a, 660a, 650b and 660b.

FIGS. 3 and 6 show exemplary designs in which an amplifier includes one main signal path and one auxiliary signal path, with the auxiliary signal path being operated to improve the linearity or noise performance of the amplifier. An amplifier may also include multiple main signal paths that may be operated to provide different gains for the amplifier. For example, more main signal paths may be selected when the input RF signal level is low in order to improve the gain and noise performance of the amplifier. An amplifier may also include multiple auxiliary signal paths that may be operated to provide different amounts of improvement in linearity or noise performance of the amplifier.

Figure 7:
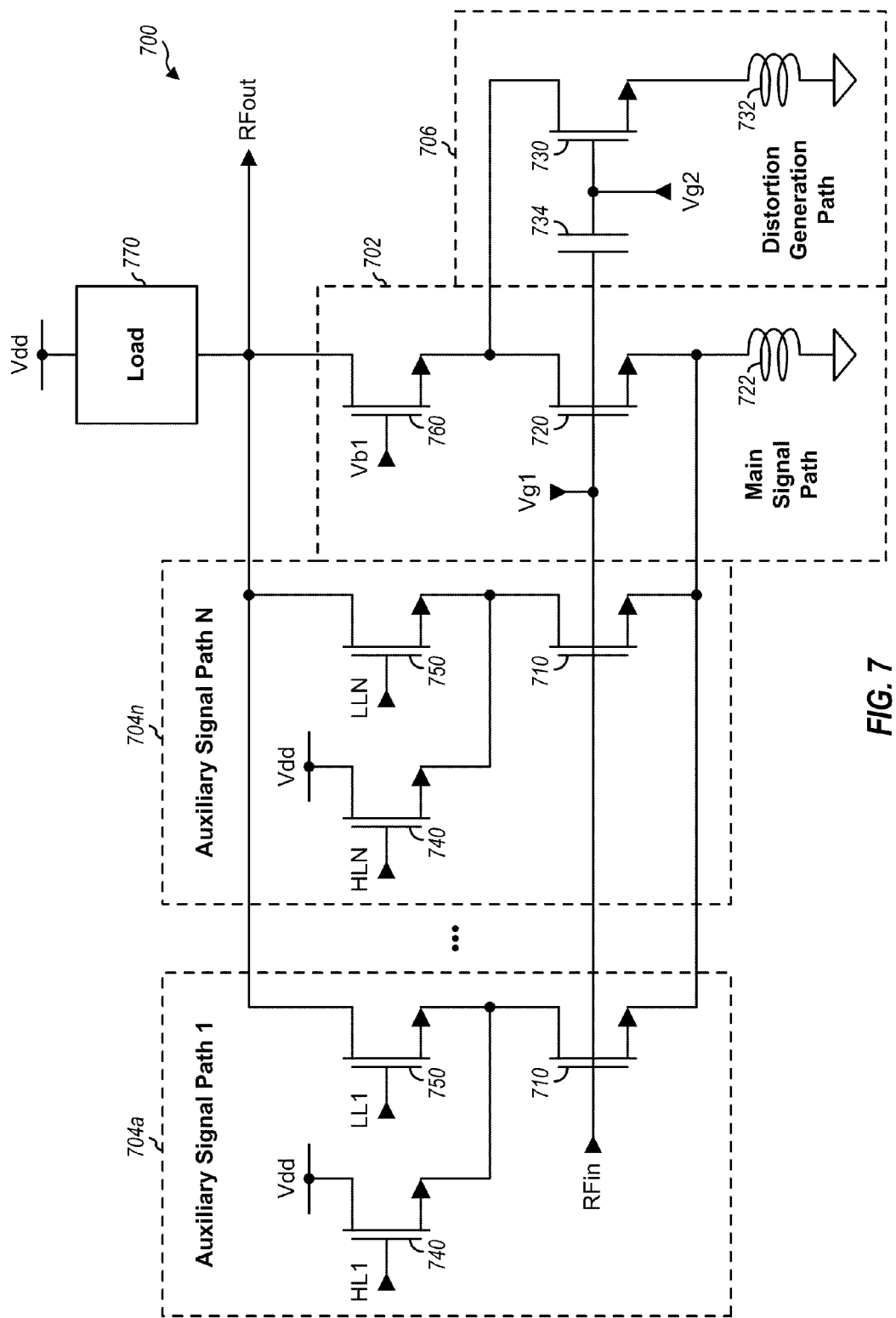
FIG. 7 shows an amplifier with multiple auxiliary signal paths.

FIG. 7 shows a schematic diagram of an exemplary design of an amplifier 700 with multiple auxiliary signal paths. Amplifier 700 is also capable of achieving high linearity and low noise figure and may be used for LNA 132 in FIG. 1 and possibly other amplifiers in receiver 130 and transmitter 150. In the exemplary design shown in FIG. 7, amplifier 700 includes a main signal path 702, N auxiliary signal paths 704a through 704n, a distortion generation path 706, and a load 770.

Main signal path 702 includes NMOS transistor 720 and 760 and an inductor 722, which are coupled in similar manner as NMOS transistors 320 and 360 and inductor 322 in FIG. 3. Distortion generation path 706 includes an NMOS transistor 730, an inductor 732, and an AC coupling capacitor 734, which are coupled in similar manner as NMOS transistors 330, inductor 332, and capacitor 334 in FIG. 3. Each auxiliary signal path 704 includes NMOS transistors 710, 740 and 750, which are coupled in similar manner as NMOS transistors 310, 340 and 350 in FIG. 3. Auxiliary signal paths 704a and 704n receive HL1 through HLN control signals, respectively, for NMOS transistors 740 and also receive LL1 through LLN control signals, respectively, for NMOS transistors 750. NMOS transistors 710, 740 and 750 in the N auxiliary signal paths 704a through 704n may have the same sizes or different sizes.

Each auxiliary signal path 704 includes a deboost path formed by NMOS transistors 710 and 740 and a cascode path formed by NMOS transistors 710 and 750. Each auxiliary signal path 704 may have its deboost path enabled with a high voltage on the HL control signal or its cascode path enabled with a high voltage on the LL control signal. The number of deboost paths to enable may be dependent on the desired linearity, and progressively more deboost paths may be enabled to obtain progressively better linearity. The number of cascode paths to enable may be dependent on the desired noise and gain performance, and progressively more cascode paths may be enabled to obtain progressively better noise and gain performance.

Figure 8:
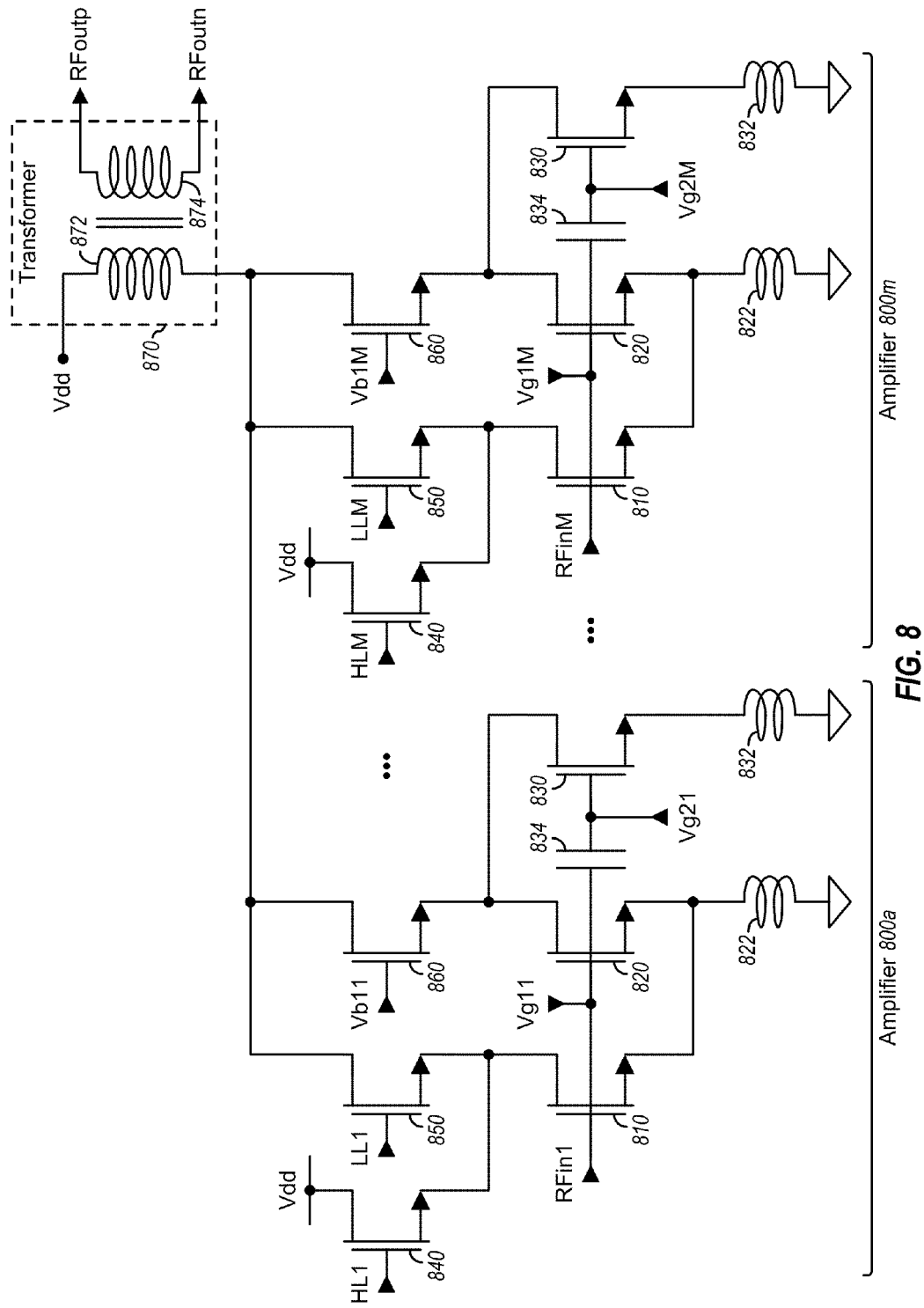
FIG. 8 shows multiple amplifiers coupled in parallel.

FIG. 8 shows a schematic diagram of an exemplary design of multiple (M) amplifiers 800a through 800m coupled in parallel. In this exemplary design, each amplifier 800 includes NMOS transistors 810, 820, 830, 840, 850 and 860, inductors 822 and 832, and a capacitor 834, which are coupled in similar manner as NMOS transistors 310, 320, 330, 340, 350 and 360, inductors 322 and 332, and capacitor 334, respectively, in FIG. 3. A load is formed by a transformer 870 having a primary coil 872 and a secondary coil 874. Primary coil 872 has one end coupled to the Vdd power supply and the other end coupled to the drains of NMOS transistors 850 and 860 in the M amplifiers 800a through 800m. Secondary coil 874 provides a differential output RF signal, RFoutp and RFoutn, and is coupled to a subsequent circuit, e.g., demodulator 134 in FIG. 1.

Amplifiers 800a through 800m may be designed for different frequency bands (e.g., cellular band and PCS band) and/or different radio technologies (e.g., GSM, CDMA 1X, WCDMA, etc.). Each amplifier 800 may receive a respective input RF signal and provide a respective output RF signal for its frequency band and/or radio technology. Amplifiers 800a through 800m may also be designed for different operating modes, e.g., high and low linearity modes, high and low power modes, etc. In any case, one or more of the M amplifiers 800a through 800m may be enabled to amplify the input RF signal(s), and remaining amplifiers may be disabled.

The amplifiers described herein may provide various advantages. First, the amplifiers may provide high linearity when the deboost path is enabled. Linearity may also be improved by the use of the distortion generation path, which may implement the MDS method or some other distortion cancellation method. Second, the amplifiers may support high frequency operation with low power consumption, which may be desirable for many wireless systems. Third, the input impedance of the amplifiers may be similar for both the high and low linearity modes, which may simplify input impedance matching for the amplifiers. Fourth, low noise figure may be obtained in the low linearity mode and high linearity may be obtained in the high linearity mode by sharing a common-source transistor for both modes. Fifth, the outputs of multiple amplifiers may be combined with one transformer, e.g., as shown in FIG. 8.

The amplifiers described herein may be able to meet or exceed stringent requirements for CDMA 1X. For example, the amplifiers may achieve an IIP3 of 6 dBm or better, a triple beat (TB) of 69 decibel (dB) or better, and a noise figure of 5 dB or lower in the high linearity mode. The amplifiers may achieve an IIP3 of −10 dBm or better, a triple beat of 49 dB or better, and a noise figure of 3 dB or lower in the low linearity mode. Computer simulation indicates that the amplifiers described herein can meet requirements of CDMA1X in PCS band with about one third to one half of the power consumption normally needed by conventional amplifiers to meet the same requirements. The amplifiers described herein may also be able to meet or exceed requirements for other systems and radio technologies.

In an exemplary design, an apparatus may comprise first through fifth transistors. The first transistor (e.g., NMOS transistor 320 in FIG. 3) may receive an input signal and provide an amplified signal. The second transistor (e.g., NMOS transistor 360) may be coupled to the first transistor and may receive the amplified signal and provide signal drive for an output signal. The third transistor (e.g., NMOS transistor 310) may be coupled to the first transistor and may receive the input signal and provide an intermediate signal. The fourth transistor (e.g., NMOS transistor 340) may be coupled to the third transistor and may provide bias for the third transistor in a high linearity mode. The fifth transistor (e.g., NMOS transistor 350) may also be coupled to the third transistor and may receive the intermediate signal and provide signal drive for the output signal in a low linearity mode. The fourth transistor may be enabled in the high linearity mode and disabled in the low linearity mode. The fifth transistor may be enabled in the low linearity mode and disabled in the high linearity mode. The input signal may observe similar input impedance in the high and low linearity modes.

The apparatus may further include a sixth transistor (e.g., NMOS transistor 330) coupled to the first transistor. The sixth transistor may generate distortion component used to cancel distortion component generated by the first transistor. The sixth transistor may have its gate receiving the input signal and its drain coupled to the drain of the first transistor, e.g., as shown in FIG. 3. The sixth transistor may also generate the distortion component based on some other input signal and may have its drain coupled to some other transistor. The sixth transistor may be enabled in the high linearity mode and disabled in the low linearity mode.

The apparatus may further include an inductor coupled to the source of the first transistor and providing source degeneration for the first transistor. The third transistor may provide more current through the inductor to increase the inductance of the inductor and improve the linearity of the first transistor in the high linearity mode. The apparatus may further include a second inductor coupled to the source of the sixth transistor and providing source degeneration for the sixth transistor.

The apparatus may include a load coupled to the second and fifth transistors. In an exemplary design, the load may comprise an inductor and a capacitor coupled in parallel, e.g., as shown in FIG. 3. In another exemplary design, the load may comprise a transformer having a primary coil and a secondary coil. The primary coil may be coupled to the second and fifth transistors (e.g., as shown in FIG. 8), and the secondary coil may be coupled to a subsequent circuit (e.g., demodulator 134 in FIG. 1).

The apparatus may comprise additional transistors for a differential design, e.g., as shown in FIG. 6. The apparatus may also include a jammer detector to detect for jammers in the input signal. The high and low linearity modes may be determined based on detected jammers in the input signal.

In another exemplary design, an apparatus may comprise an amplifier (e.g., an LNA) to receive an input signal and provide an output signal. The amplifier may comprise a main signal path and an auxiliary signal path coupled in parallel, e.g., as shown in FIG. 3. The main signal path may receive and amplify the input signal and provide the output signal. The auxiliary signal path may comprise a first path (e.g., a deboost path) and a second path (e.g., a cascode path). The first path may be enabled to improve the linearity of the amplifier. The second path may be enabled to improve the gain and noise performance of the amplifier. The first and second paths may share a common source transistor, e.g., NMOS transistor 310. The amplifier may further comprise a distortion generation path coupled in parallel with the main signal path. The distortion generation path may generate distortion component used to cancel distortion component generated by the main signal path.

The amplifier may further comprise a second auxiliary signal path coupled in parallel with the main signal path and comprising third and fourth paths, e.g., as shown in FIG. 7. The third path (e.g., another deboost path) may be enabled to improve the linearity of the amplifier. The fourth path (e.g., another cascode path) may be enabled to improve the gain and noise performance of the amplifier. The third and fourth paths may share a second common source transistor.

The apparatus may further comprise a second amplifier to receive a second input signal and provide a second output signal, e.g., as shown in FIG. 8. The two amplifiers may have their outputs coupled together and to a primary coil of a transformer, e.g., as shown in FIG. 8. The amplifiers may also provide their outputs separately.

In another exemplary design, a wireless communication device may comprise an antenna providing an input RF signal and an LNA amplifying the input RF signal and providing an output RF signal. The LNA may comprise first through fifth transistors. The first transistor (e.g., NMOS transistor 320) may receive the input RF signal and provide an amplified signal. The second transistor (e.g., NMOS transistor 360) may receive the amplified signal and provide signal drive for the output RF signal. The third transistor (e.g., NMOS transistor 310) may receive the input RF signal and provide an intermediate signal. The fourth transistor (e.g., NMOS transistor 340) may provide bias for the third transistor in a high linearity mode. The fifth transistor (e.g., NMOS transistor 350) may receive the intermediate signal and provide signal drive for the output RF signal in a low linearity mode. The LNA may further comprise a sixth transistor (e.g., NMOS transistor 330) that may generate distortion component used to cancel distortion component generated by the first transistor in the high linearity mode.

Figure 9:
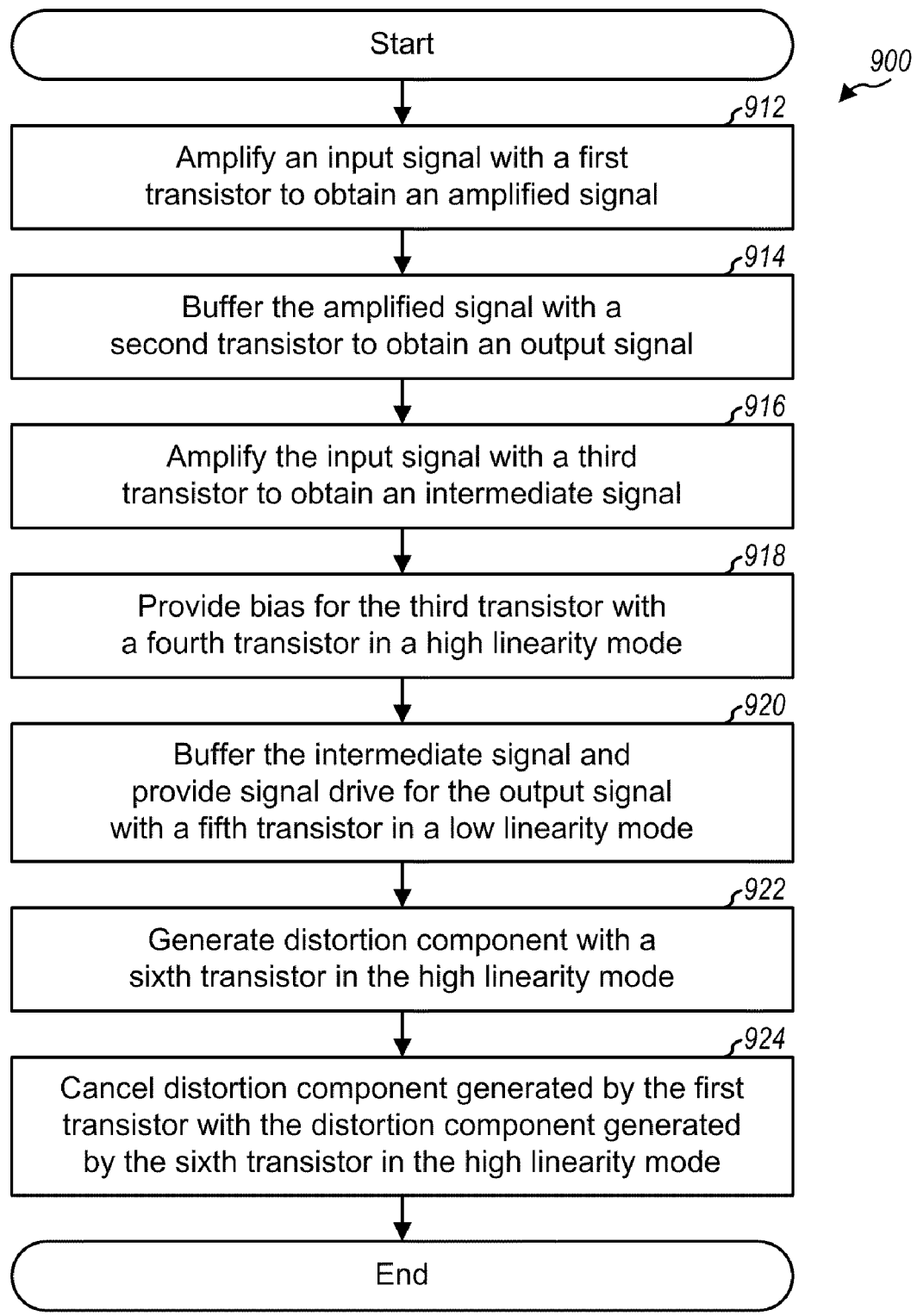
FIG. 9 shows a process for performing signal amplification.

FIG. 9 shows an exemplary design of a process 900 for performing signal amplification. An input signal may be amplified with a first transistor to obtain an amplified signal (block 912). The amplified signal may be buffered with a second transistor to obtain an output signal (block 914). The input signal may also be amplified with a third transistor to obtain an intermediate signal (block 916). Bias for the third transistor may be provided with a fourth transistor in a high linearity mode (block 918). The intermediate signal may be buffered, and signal drive may be provided for the output signal with a fifth transistor in a low linearity mode (block 920). Distortion component may be generated with a sixth transistor in the high linearity mode (block 922). Distortion component generated by the first transistor may be canceled with the distortion component generated by the sixth transistor in the high linearity mode (block 924).

The amplifiers described herein may be implemented on an IC, an analog IC, an RFIC, a mixed-signal IC, an ASIC, a printed circuit board (PCB), an electronics device, etc. The amplifiers may also be fabricated with various IC process technologies such as complementary metal oxide semiconductor (CMOS), NMOS, PMOS, bipolar junction transistor (BJT), bipolar-CMOS (BiCMOS), silicon germanium (SiGe), gallium arsenide (GaAs), etc.

An apparatus implementing the amplifiers described herein may be a stand-alone device or may be part of a larger device. A device may be (i) a stand-alone IC, (ii) a set of one or more ICs that may include memory ICs for storing data and/or instructions, (iii) an RFIC such as an RF receiver (RFR) or an RF transmitter/receiver (RTR), (iv) an ASIC such as a mobile station modem (MSM), (v) a module that may be embedded within other devices, (vi) a receiver, cellular phone, wireless device, handset, or mobile unit, (vii) etc.

In one or more exemplary designs, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media.

The previous description of the disclosure is provided to enable any person skilled in the art to make or use the disclosure. Various modifications to the disclosure will be readily apparent to those skilled in the art, and the generic principles defined herein may be applied to other variations without departing from the scope of the disclosure. Thus, the disclosure is not intended to be limited to the examples and designs described herein but is to be accorded the widest scope consistent with the principles and novel features disclosed herein.

What is claimed is:

1. An apparatus comprising:
    a first transistor receiving an input signal and providing an amplified signal;
    a second transistor coupled to the first transistor, the second transistor receiving the amplified signal and providing signal drive for an output signal;
    a third transistor coupled to and sharing a common source degeneration element with the first transistor, the third transistor receiving the input signal and providing an intermediate signal;
    a fourth transistor coupled to the third transistor and providing bias for the third transistor in a high linearity mode;
    a fifth transistor coupled to the third transistor, the fifth transistor receiving the intermediate signal and providing signal drive for the output signal in a low linearity mode; and
    a sixth transistor having a drain coupled between a source of the second transistor and a drain of the first transistor and configured to cancel distortion generated by the first transistor.

2. The apparatus of claim 1, the fourth transistor being enabled in the high linearity mode and disabled in the low linearity mode, and the fifth transistor being enabled in the low linearity mode and disabled in the high linearity mode.

3. The apparatus of claim 1, further comprising:
    another source degeneration element coupled between a source of the sixth transistor and a ground voltage.

4. The apparatus of claim 3, the sixth transistor having a gate receiving the input signal and a drain coupled to a drain of the first transistor.

5. The apparatus of claim 3, the sixth transistor being enabled in the high linearity mode and disabled in the low linearity mode.

6. The apparatus of claim 1, further comprising:
    an inductor coupled to a source of the first transistor and providing source degeneration for the first transistor.

7. The apparatus of claim 6, the third transistor providing more current through the inductor to increase inductance of the inductor and improve linearity of the first transistor in the high linearity mode.

8. The apparatus of claim 3, further comprising:
a first inductor coupled to a source of the first transistor and providing source degeneration for the first transistor; and
a second inductor coupled to a source of the sixth transistor and providing source degeneration for the sixth transistor.

9. The apparatus of claim 1, further comprising:
a load coupled to the second and fifth transistors and comprising an inductor and a capacitor coupled in parallel.

10. The apparatus of claim 1, further comprising:
a transformer comprising a primary coil and a secondary coil, the primary coil being coupled to the second and fifth transistors, and the secondary coil being coupled to a subsequent circuit.

11. The apparatus of claim 1, the input signal observing similar input impedance in the high linearity mode and the low linearity mode.

12. The apparatus of claim 1, further comprising:
a sixth transistor receiving a complementary input signal and providing a complementary amplified signal;
a seventh transistor coupled to the sixth transistor, the seventh transistor receiving the complementary amplified signal and providing signal drive for a complementary output signal;
an eight transistor receiving the complementary input signal and providing a complementary intermediate signal;
a ninth transistor coupled to the eight transistor and providing bias for the eight transistor in the high linearity mode; and
a tenth transistor coupled to the eight transistor, the tenth transistor receiving the complementary intermediate signal and providing signal drive for the complementary output signal in the low linearity mode.

13. The apparatus of claim 1, further comprising:
a jammer detector to detect for jammers in the input signal, the high and low linearity modes being determined based on detected jammers in the input signal.

14. An apparatus comprising:
an amplifier to receive an input signal and provide an output signal, the amplifier comprising:
a main signal path comprising a source degeneration element and configured for receiving and amplifying the input signal and providing the output signal;
an auxiliary signal path coupled in parallel with the main signal path and comprising a first path and a second path, the first path being enabled to improve linearity of the amplifier, the second path being enabled to improve gain and noise performance of the amplifier, the first and second paths sharing a common source transistor, the source degeneration element providing source degeneration for the main path and the auxiliary path; and
a distortion generation path comprising another source degeneration element coupled between a switching element and the ground voltage, the distortion generation path coupled to the main signal path and enabled to at least partially cancel distortion components from main signal path.

15. The apparatus of claim 14, the main signal path comprising
a first transistor receiving the input signal and providing an amplified signal, and
a second transistor coupled to the first transistor, the second transistor receiving the amplified signal and providing signal drive for the output signal.

16. The apparatus of claim 14, the auxiliary signal path comprising
a first transistor receiving the input signal and providing an intermediate signal, the first transistor being the common source transistor,
a second transistor coupled to the first transistor, the second transistor providing bias for the first transistor in a high linearity mode to improve the linearity of the amplifier, the first path comprising the first and second transistors, and
a third transistor coupled to the first transistor, the third transistor receiving the intermediate signal and providing signal drive for the output signal in a low linearity mode to improve the gain and noise performance of the amplifier, the second path comprising the first and third transistors.

17. The apparatus of claim 14, the amplifier further comprising:
a distortion generation path coupled in parallel with the main signal path, the distortion generation path generating distortion component used to cancel distortion component generated by the main signal path.

18. The apparatus of claim 14, the amplifier further comprising:
a second auxiliary signal path coupled in parallel with the main signal path and comprising a third path and a fourth path, the third path being enabled to improve the linearity of the amplifier, the fourth path being enabled to improve the gain and noise performance of the amplifier, the third and fourth paths sharing a second common source transistor.

19. The apparatus of claim 14, further comprising:
a second amplifier to receive a second input signal and provide a second output signal, the amplifier and the second amplifier having outputs coupled together; and
a transformer having a primary coil and a secondary coil, the primary coil having one end coupled to the outputs of the amplifier and the second amplifier.

20. A wireless communication device comprising:
an antenna providing an input radio frequency (RF) signal; and
a low noise amplifier (LNA) amplifying the input RF signal and providing an output RF signal, the LNA comprising
a first transistor receiving the input RF signal and providing an amplified signal;
a second transistor coupled to the first transistor, the second transistor receiving the amplified signal and providing signal drive for the output RF signal;
a third transistor coupled to and sharing a common source degeneration element with the first transistor, the third transistor receiving the input RF signal and providing an intermediate signal;
a fourth transistor coupled to the third transistor and providing bias for the third transistor in a high linearity mode;
a fifth transistor coupled to the third transistor, the fifth transistor receiving the intermediate signal and providing signal drive for the output RF signal in a low linearity mode; and
a sixth transistor having a drain coupled between a source of the second transistor and a drain of the first transistor and configured to cancel distortion generated by the first transistor.

21. The wireless communication device of claim 20, the LNA further comprising another source degeneration element coupled between a source of the sixth transistor and a ground voltage.

22. A method of performing signal amplification, comprising:
- amplifying an input signal with a first transistor to obtain an amplified signal;
- buffering the amplified signal with a second transistor to obtain an output signal;
- amplifying the input signal with a third transistor to obtain an intermediate signal;
- providing bias for the third transistor with a fourth transistor in a high linearity mode;
- buffering the intermediate signal and providing signal drive for the output signal with a fifth transistor in a low linearity mode; and
- generating distortion components for distortion cancellation with a sixth transistor having a drain coupled between a source of the second transistor and a drain of the first transistor in a high linearity mode.

23. The method of claim 22, further comprising:
- generating distortion component with a sixth transistor in the high linearity mode; and
- canceling distortion component generated by the first transistor with the distortion component generated by the sixth transistor in the high linearity mode.

24. The method of claim 22, further comprising:
- enabling the fourth transistor in the high linearity mode;
- disabling the fourth transistor in the low linearity mode;
- enabling the fifth transistor in the low linearity mode; and
- disabling the fifth transistor in the high linearity mode.

25. An apparatus comprising:
- means for amplifying an input signal to obtain an amplified signal;
- means for buffering the amplified signal to obtain an output signal;
- means for amplifying the input signal to obtain an intermediate signal;
- means for providing bias to the means for amplifying the input signal to obtain the intermediate signal in a high linearity mode;
- means for buffering the intermediate signal and providing signal drive for the output signal in a low linearity mode;
- means for providing source degeneration for the means for amplifying an input signal to obtain an amplified signal and the means for amplifying the input signal to obtain an intermediate signal; and
- means for generating distortion components for distortion cancellation with a means for generating distortion having a drain coupled between a drain of the means for amplifying an input signal to obtain an amplified signal and a source of the means for buffering the amplified signal in a high linearity mode.

* * * * *